United States Patent
Liu et al.

(10) Patent No.: US 11,971,307 B2
(45) Date of Patent: Apr. 30, 2024

(54) DEVICE AND METHOD FOR MEASURING WAVELENGTH FOR LASER DEVICE

(71) Applicant: Beijing RSLaser Opto-Electronics Technology Co., Ltd., Beijing (CN)

(72) Inventors: Guangyi Liu, Beijing (CN); Rui Jiang, Beijing (CN); Xiaoquan Han, Beijing (CN); Jiangshan Zhao, Beijing (CN); Pengfei Sha, Beijing (CN); Qingqing Yin, Beijing (CN); Hua Zhang, Beijing (CN)

(73) Assignee: Beijing RSLaserOpto-Electronics Technology Co. Ltd, Beijing (CN)

( * ) Notice: Subject to any disclaimer, the term of this patent is extended or adjusted under 35 U.S.C. 154(b) by 0 days.

(21) Appl. No.: 17/915,434

(22) PCT Filed: Dec. 11, 2020

(86) PCT No.: PCT/CN2020/135615
§ 371 (c)(1),
(2) Date: Sep. 28, 2022

(87) PCT Pub. No.: WO2021/196723
PCT Pub. Date: Oct. 7, 2021

(65) Prior Publication Data
US 2023/0144290 A1    May 11, 2023

(30) Foreign Application Priority Data

Mar. 31, 2020 (CN) .......................... 202010244216.8

(51) Int. Cl.
*G01J 9/02* (2006.01)
(52) U.S. Cl.
CPC ..... *G01J 9/0246* (2013.01); *G01J 2009/0234* (2013.01); *G01J 2009/0257* (2013.01)

(58) Field of Classification Search
CPC ............ G01J 9/0246; G01J 2009/0234; G01J 2009/0257; G03F 7/7085; G03F 7/70575
See application file for complete search history.

(56) References Cited

U.S. PATENT DOCUMENTS

| 10,890,484 B2 | 1/2021 | Moriya |
| 2003/0035121 A1* | 2/2003 | Nebendahl ............ H01S 5/0687 356/519 |

(Continued)

FOREIGN PATENT DOCUMENTS

| CN | 101832821 A | 9/2010 |
| CN | 102023056 | 4/2011 |

(Continued)

OTHER PUBLICATIONS

English Translation of International Search Report of PCT Application No. PCT/CN2020/135615 Filed Nov. 2, 2020, 3 Pages.

(Continued)

*Primary Examiner* — Jonathan M Hansen
(74) *Attorney, Agent, or Firm* — Shook, Hardy & Bacon L.L.P.

(57) ABSTRACT

According to the present disclosure, there is provided a device (2) and a method for measuring a wavelength for a laser device. The device (2) for measuring a wavelength for a laser device includes: a first optical path assembly and a second optical path assembly. The first optical path assembly and the second optical path assembly constitute a laser wavelength measurement optical path. The second optical path assembly includes: an FP etalon assembly (11) and an optical classifier (13). The homogenized laser beam passes through the FP etalon assembly (11) to generate an interference fringe. The optical classifier (13) is arranged after the FP etalon assembly (11) in the laser wavelength measure- (Continued)

ment optical path, and configured to deflect the laser beam passing through the FP etalon assembly (11).

10 Claims, 4 Drawing Sheets

(56) References Cited

U.S. PATENT DOCUMENTS

| | | | | |
|---|---|---|---|---|
| 2003/0137672 | A1* | 7/2003 | Moriya | ............ G01J 9/0246 356/519 |
| 2014/0125984 | A1 | 5/2014 | Yamamoto et al. | |

FOREIGN PATENT DOCUMENTS

| | | |
|---|---|---|
| CN | 202710187 | 1/2013 |
| CN | 104236725 A | 12/2014 |
| CN | 106940220 A | 7/2017 |
| CN | 107063478 | 8/2017 |
| CN | 108507686 | 9/2018 |
| CN | 108844641 A | 11/2018 |
| CN | 109073463 | 12/2018 |
| CN | 109489837 A | 3/2019 |
| CN | 110595351 A | 12/2019 |
| CN | 111289124 | 6/2020 |
| JP | H06-186086 A | 7/1994 |
| JP | 2002-148123 A | 5/2002 |
| JP | 2003-214958 A | 7/2003 |
| WO | 2004/085980 A1 | 10/2010 |
| WO | 2017/199395 A1 | 11/2017 |

OTHER PUBLICATIONS

Office Action received for Japanese Patent Application No. 2022-560158, mailed on Sep. 26, 2023, 6 pages. [English Translation submitted].

* cited by examiner ism dispersion and a grating dispersion. The interference method includes a Fourier transform method and a Fabry-Perot etalon (hereinafter referred to as a FP etalon) method.

DEVICE AND METHOD FOR MEASURING WAVELENGTH FOR LASER DEVICE

CROSS REFERENCE TO RELATED APPLICATION

This application is a Section 371 National Stage Application of International Application No. PCT/CN2020/135615, filed on Dec. 11, 2020, entitled "DEVICE AND METHOD FOR MEASURING WAVELENGTH FOR LASER DEVICE", which is incorporated herein by reference in its entirety which claims priority to Chinese Application No. 202010244216.8, filed on Mar. 31, 2020, incorporated herein by reference in their entirety.

TECHNICAL FIELD

The present disclosure relates to a field of laser spectrum measurement technology, and in particular, to a device and a method for measuring a wavelength for a laser device.

BACKGROUND

A laser device is important light source equipment in the modern industry, and may be applied in the fields of lighting, laser processing, projection display, optical communication, material analysis, testing and measurement, semiconductor processing, etc. In some high-level fields (such as in the fields of testing and measurement and semiconductor processing), lasers are required to have a very high wavelength stability. Therefore, it is necessary to design a corresponding device for measuring a wavelength for a laser device, and achieve a closed-loop feedback on the wavelength for the laser device according to the measurement result, so as to ensure a stable output of the wavelength for the laser device.

In the field of semiconductor processing technology, an excimer laser device is the main light source used in a semiconductor lithography process. For example, a central wavelength for an ArF excimer laser device is 193.4 nm, and a center wavelength for a KrF excimer laser device is 248.3 nm. A change of the central wavelength for the laser device directly affects a change of an exposure focal plane of a lithography machine, which will cause an exposure line to become wider and result in a decrease in a yield of chips. In addition, for the 110 nm process node, a stability of the central wavelength for the laser device is required to be higher than 0.05 pm, while for the 28 nm process node, a stability of the central wavelength for the laser device is required to be higher than 0.03 pm.

Therefore, it is necessary to design a device for measuring a wavelength having a pm level for a wavelength measurement for a laser device. The wavelength for the laser device is measured in real time by the device for measuring the wavelength, and a closed-loop control is performed, so as to achieve a stable output of the wavelength for the laser device.

There are many methods for measuring a laser wavelength for a laser device, such as a dispersion method and am interferometric method. The dispersion method includes a prism dispersion and a grating dispersion. The interference method includes a Fourier transform method and a Fabry-Perot etalon (hereinafter referred to as a FP etalon) method.

The wavelength measurements based on the prism dispersion method and a low-order blazed grating method are low in precision, and a high-precision wavelength measurement may not be achieved. In addition, the wavelength measurement based on the Fourier transform method requires a mechanical movement of an element, is poor in stability, and a high-speed wavelength measurement may not be achieved.

Existing high-speed and high-precision methods for measuring a wavelength for a laser device mainly include an echelle grating method and an FP etalon method. When the central wavelength for the laser device is measured by the echelle grating, the echelle grating has a high diffraction order and a high-precision central wavelength measurement may be achieved. However, an echelle grating wavelength meter is huge in volume, is not suitable for an on-line measurement for a wavelength for a laser device, and is generally used for an off-line measurement. The FP etalon method is an ideal selection for an on-line measurement for a wavelength for a laser device due to a small volume and a high spectral resolution. By the FP etalon method, an interference fringe is generated after a laser passes through an FP etalon, and a wavelength for an incident laser device is obtained according to a position of a peak of the interference fringe.

However, a range of wavelengths measured by the existing FP etalons is relatively small, and generally it is impossible to achieve a wavelength measurement having a large range and a high precision by one FP etalon. For example, in a wavelength measurement by a combination of the FP etalon with the grating, an incident laser is divided into two beams, which are respectively irradiated on the grating and the FP etalon. The grating is used for a coarse measurement of the wavelength, while the FP etalon is used for a fine measurement of the wavelength, so as to obtain a precise value of the wavelength for the laser device.

In addition, a wavelength for a laser device may also be measured by two FP etalons. One of the FP etalons has a larger measurement range and is used for a coarse measurement of a central wavelength, while the other FP etalon has a smaller measurement range and is used for a fine measurement of the central wavelength. A beam splitter is used to divide a laser beam of the laser device into two beams, which are respectively irradiated on the two FP etalons, and then interference fringes for the two FP etalons are calculated to obtain a coarse and a fine wavelength measurement results, thereby obtaining a precise value of the wavelength for the laser device.

In addition, a wavelength may also be measured by connecting two FP etalons in series. One FP etalon coarsely determines a wavelength deviation, while the other FP etalon finely determines the wavelength deviation. A deviation of the wavelength for the laser device is obtained by comparing intensities of interference signals after the two FP etalons, so as to maintain a stability of the wavelength for the laser device.

Alternatively, two parallel FP etalons and a grating are used as interference filters to detect an intensity of an incident laser device. A wavelength measurement precision of each filter is different, and the wavelength for the laser device is measured order by order to obtain a precise value of the wavelength for the laser device.

Based on the above methods for measuring a wavelength for a laser device, at least two sets of wavelength measurement devices are desired. One (or more) thereof is used for a coarse wavelength measurement, while the other thereof is used for a fine wavelength measurement using the FP etalon method. Since an incident laser beam needs to be split, the two sets of wavelength measurement devices are impossible to achieve a complete common optical path, and the devices are more complicated. A final wavelength measurement result only depends on a fine measurement result of one FP etalon. This is easily affected by the external environment, and the precision and the stability of wavelength measurement are relatively poor.

SUMMARY

According to an aspect of the present disclosure, there is provided a device for measuring a wavelength for a laser device, including: a first optical path assembly and a second optical path assembly. The first optical path assembly is configured to homogenize a laser beam emitted by the laser device. The second optical path assembly constitutes a laser wavelength measurement optical path with the first optical path assembly, and is configured to perform a hierarchical imaging on the laser beam homogenized by the first optical path assembly. The second optical path assembly includes: an FP etalon assembly and an optical classifier. The homogenized laser beam passes through the FP etalon assembly to generate an interference fringe. The optical classifier is arranged after the FP etalon assembly in the laser wavelength measurement optical path, and configured to deflect the laser beam passing through the FP etalon assembly, so as to achieve the hierarchical imaging.

According to the embodiments of the present disclosure, the first optical path assembly includes: a beam splitter and a light homogenizing assembly arranged in sequence along the laser wavelength measurement optical path. The beam splitter is configured to reflect a portion of the laser beam emitted by the laser device to the laser wavelength measurement optical path. The light homogenizing assembly is configured to homogenize the laser beam reflected by the beam splitter to the laser wavelength measurement optical path.

According to the embodiments of the present disclosure, the homogenizing assembly includes: an optical light homogenizing element, a first convergent mirror and a reflecting mirror arranged in sequence along the laser wavelength measurement optical path. The optical light homogenizing element is configured to homogenize the laser beam, so as to reduce an influence of a quality of the laser beam on a measurement precision. The first convergent mirror is configured to converge the laser beam homogenized by the optical light homogenizing element to the second optical path assembly. The reflecting mirror is configured to reflect the laser beam converged by the first convergent mirror to the second optical path assembly.

According to the embodiments of the present disclosure, the second optical path assembly further includes: a light homogenizing sheet, a field diaphragm and a collimating mirror arranged in sequence along the laser wavelength measurement optical path. The light homogenizing sheet is correspondingly arranged after the first optical path assembly in the laser wavelength measurement optical path, and configured to further homogenize the laser beam passing through the first optical path assembly and being incident on the second optical path assembly. The field diaphragm is configured to control an imaging range of the laser beam homogenized by the light homogenizing sheet in the hierarchical imaging. The collimating mirror is correspondingly arranged before the FP etalon assembly in the laser wavelength measurement optical path, and configured to ensure a collimating characteristic of the laser beam incident on the FP etalon assembly.

According to the embodiments of the present disclosure, the second optical path assembly further includes: an aperture diaphragm arranged between the FP etalon assembly and the optical classifier in the laser wavelength measurement optical path, and configured to limit a direction of the laser beam passing through the FP etalon assembly.

According to the embodiments of the present disclosure, the second optical path assembly further includes: a second convergent mirror and an imaging apparatus arranged in sequence along the laser wavelength measurement optical path. The second convergent mirror is arranged after the optical classifier in the laser wavelength measurement optical path, and configured to converge the laser beam passing through the optical classifier to the imaging apparatus. The imaging apparatus is configured to image the laser beam passing through the second convergent mirror.

According to the embodiments of the present disclosure, the FP etalon assembly includes: a housing, a first FP etalon, and a second FP etalon. The housing is configured to constitute a sealed cavity of the FP etalon assembly. The first FP etalon is arranged inside the sealed cavity, and configured to correspondingly generate a first interference fringe for the hierarchical imaging. The second FP etalon is arranged inside the sealed cavity and corresponding to the first FP etalon, and configured to correspondingly generate a second interference fringe for the hierarchical imaging.

According to the embodiments of the present disclosure, the first FP etalon and the second FP etalon satisfy:

$$k = \frac{2|FSR_1 - FSR_2|}{|FSR_1 + FSR_2|}$$

wherein, k<0.2, FSR1 is a free spectral range of the first FP etalon, and FSR2 is a free spectral range of the second FP etalon.

According to the embodiments of the present disclosure, the housing includes: a first sealing groove, a first sealing ring, a first window member, a second sealing groove, a second sealing ring, and a second window member. The first sealing groove is arranged corresponding to a light inlet of the housing. The first sealing ring is matched with the first sealing groove and arranged on the light inlet. The first window member is matched with the first sealing ring and arranged inside the first sealing groove. The second sealing groove is arranged corresponding to a light outlet of the housing. The second sealing ring is matched with the second sealing groove and arranged on the light outlet. The second window member is matched with the second sealing ring and arranged inside the second sealing groove. Both the first window member and the second window member are provided with anti-reflection films thereon, or a normal of a light entrance surface and/or a normal of a light exit surface of the first window member forms a first included angle with an incident direction of the laser beam, and/or a normal of a light entrance surface and/or a normal of a light exit surface of the second window member forms a second included angle with an incident direction of the laser beam, and the first included angle or the second included angle is 5 degrees to 10 degrees.

According to the embodiments of the present disclosure, the optical classifier includes: a first deflecting member and a second deflecting member. The first deflecting member has a first wedge angle and is configured to deflect the laser beam passing through the first FP etalon. The second deflecting member has a second wedge angle, is arranged corresponding to the first wedge angle of the first deflecting member, and is configured to deflect the laser beam passing through the second FP etalon.

According to the embodiments of the present disclosure, the optical classifier includes: a third deflecting member having a third wedge angle and configured to deflect the laser beam passing through the first FP etalon, or deflect the laser beam passing through the second FP etalon.

According to the embodiments of the present disclosure, the optical classifier includes: a fourth deflecting member, including: a light transmitting hole penetrating the fourth deflecting member parallel to a light entrance direction of the laser beam. When the fourth deflecting member deflects the laser beam passing through the first FP etalon, the light transmitting hole is configured to allow the laser beam passing through the second FP etalon to penetrate the light transmitting hole. When the fourth deflecting member deflects the laser beam passing through the second FP etalon, the light transmitting hole is configured to allow the laser beam passing through the first FP etalon to penetrate the light transmitting hole.

According to another aspect of the present disclosure, there is provided a system for measuring a wavelength for a laser device, including the above device for measuring a wavelength for a laser device and a laser device. The laser device is configured to generate a laser beam incident on the device for measuring a wavelength for a laser device.

According to yet another aspect of the present disclosure, there is provided a method for measuring a wavelength for a laser device applied in the above device for measuring a wavelength for a laser device to measure a laser wavelength for the laser device.

DETAILED DESCRIPTION OF EMBODIMENTS

In order to make the objectives, technical solutions and advantages of the present disclosure clearer, the present disclosure will be further described in detail below with reference to the specific embodiments and the accompanying drawings.

In the related art, a device for measuring a wavelength for a laser device has the technical problems that a complete common optical path may not be achieved, the device is relatively complex, and the wavelength measurement result is easily affected by external influences, resulting in poor precision and stability of the wavelength measurement. In order to solve these problems, the present disclosure provides a device and a method for measuring a wavelength for a laser device.

Figure 1A:
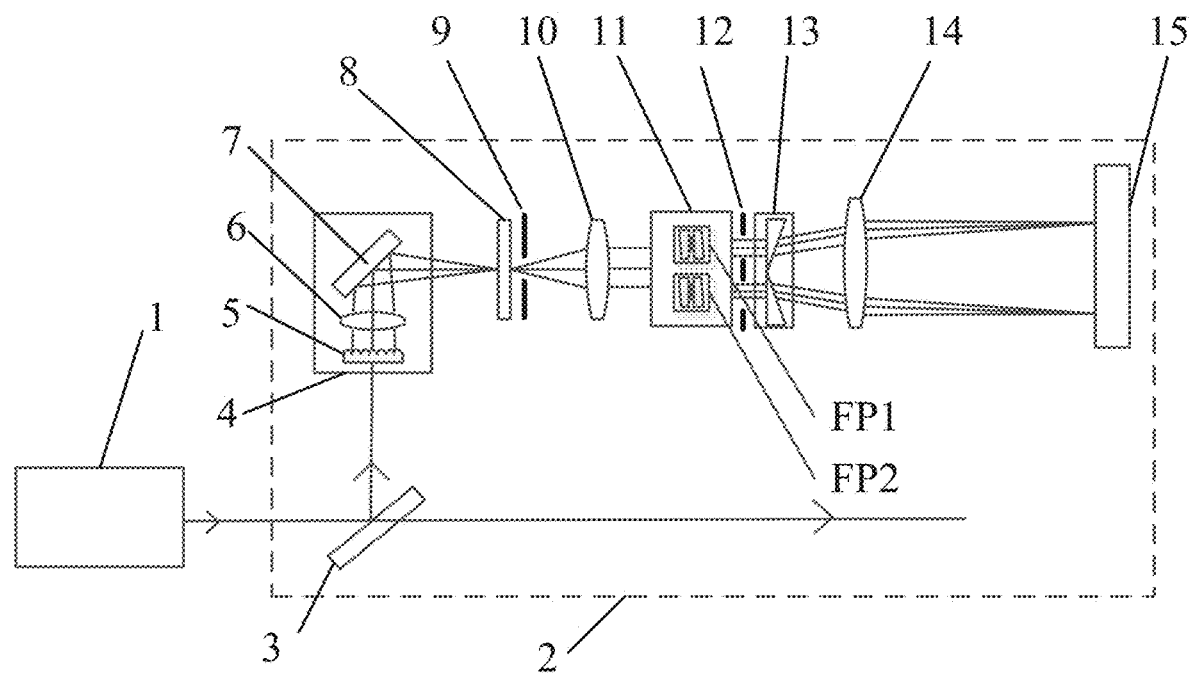
FIG. 1A is a schematic structural constitution diagram of a device for measuring a wavelength for a laser device according to an embodiment of the present disclosure.
Figure 1B:
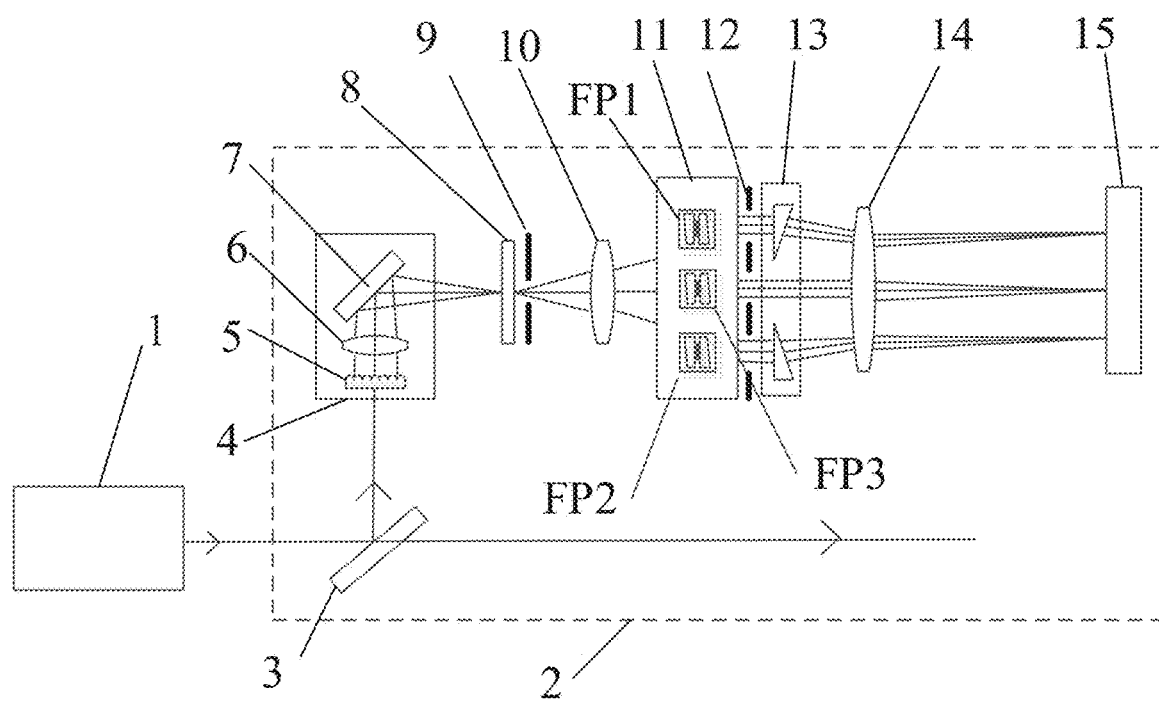
FIG. 1B is a schematic structural constitution diagram of a device for measuring a wavelength for a laser device according to another embodiment of the present disclosure.

According to an aspect of the present disclosure, there is provided a device for measuring a wavelength for a laser device. As shown in FIG. 1A and FIG. 1B, a device 2 for measuring a wavelength for a laser device includes: a first optical path assembly and a second optical path assembly. The first optical path assembly is configured to homogenize a laser beam emitted by the laser device 1. The second optical path assembly is arranged corresponding to the first optical path assembly, constitutes a laser wavelength measurement optical path with the first optical path assembly, and is configured to perform a hierarchical imaging on the laser beam homogenized by the first optical path assembly. After being incident on the first optical path assembly, the laser beam to be measured generated by the laser device 1 passes through the first optical path assembly and is incident on the second optical path assembly along the above laser wavelength measurement optical path, and is performed by the hierarchical imaging in the second optical path assembly, so as to obtain a measurement result such as an interference fringe corresponding to the laser beam.

According to the embodiments of the present disclosure, the second optical path assembly includes: an FP etalon assembly 11 and an optical classifier 13. The FP etalon assembly 11 is configured to generate an interference fringe corresponding to a laser beam. Specifically, after being irradiated on the imaging apparatus 15, the laser beam passing through the FP etalon assembly 11 is detected by the imaging apparatus 15, so that a corresponding interference fringe thereof is obtained, i.e., the homogenized laser beam passes through the FP etalon assembly to generate the interference fringe. The FP etalon assembly 11 may include a plurality of FP etalons. For example, two FP etalons may be sealed in the same cavity of the FP etalon assembly. Therefore, at least two FP etalons share the same optical path for interference imaging, so that the optical path has a compact structure and higher stability. At the same time, in a design of the FP etalon assembly including at least two FP etalons, as free spectral ranges FSRs of the FP etalons are relatively similar, the FP etalons may all achieve a precise measurement for the wavelength of the laser beam. The wavelength measurement result may be an average value of the measurement results of at least two FP etalons, so that the wavelength measurement precision is further improved. Meanwhile, the wavelength measurement range may also be a product of the free spectral ranges FSRs of at least two FP etalons, which further increases the wavelength measurement range.

In addition, the optical classifier 13 is correspondingly arranged after the FP etalon assembly 11 in the laser wavelength measurement optical path, and is configured to deflect the laser beam passing through the FP etalon assembly 11, so as to achieve the hierarchical imaging. The laser beam passes through the FP etalon assembly 11 and is incident on the optical classifier 13 along the above laser wavelength measurement optical path. The optical classifier 13 may deflect the laser beam into two beams, so that the interference fringes corresponding to the laser beams are imaged separately on the imaging apparatus 15. This helps obtaining the wavelength of the incident laser beam by calculating the intensity positions of the two interference fringes.

The FP etalon assembly 11 of the present disclosure allows at least two FP etalons to share the same optical path for an interference imaging, and therefore a compact structure having a small volume, a simple design and a high stability are achieved. In cooperation with the optical classifier 13, a precise measurement for a laser wavelength for a laser device may be achieved, and at the same time a wavelength measurement range is large. It is suitable for an online measurement for a laser wavelength and a corresponding closed-loop control feedback.

According to the embodiments of the present disclosure, as shown in FIG. 1A and FIG. 1B, the first optical path assembly includes: a beam splitter 3 and a light homogenizing element 4 arranged in sequence along the laser wavelength measurement optical path. A laser beam to be measured generated by the laser device 1 is incident on the device 2 for measuring a wavelength for a laser device. Specifically, the laser beam to be measured is incident into the first optical path assembly. In the first optical path assembly, the laser beam to be measured is irradiated on the beam splitter 3. The beam splitter 3 is a flat glass or a glass having a wedge angle, configured to transmit most of the light therethrough, and also configured to reflect a portion of the laser beam emitted by the laser device to the laser wavelength measurement optical path. That is, a portion of the laser beam to be measured is reflected and incident in the light homogenizing element of the first optical path assembly. The homogenizing assembly 4 is correspondingly arranged behind the beam splitter 3 in the laser wavelength measurement optical path, and is configured to homogenize the laser beam reflected by the beam splitter 3 to the laser wavelength measurement optical path.

According to the embodiments of the present disclosure, as shown in FIG. 1A and FIG. 1B, the homogenizing assembly 4 includes: an optical light homogenizing element 5, a first convergent mirror 6 and a reflecting mirror 7 arranged in sequence along the laser wavelength measurement optical path. The optical light homogenizing element 5 is configured to homogenize the laser beam, so as to reduce an influence of a quality of the laser beam on a measurement precision. The optical homogenizing element 5 may be an element such as a microlens array, an optical integrator rod or a diffractive optical element (DOE). The first convergent mirror 6 is configured to converge the laser beam homogenized by the optical homogenizing element 5 into the second optical path assembly. A reflecting mirror 7 may also be arranged between the second optical path assembly and the first convergent mirror 6. The reflecting mirror 7 is configured to reflect the laser beam converged by the first convergent mirror 6 into the second optical path assembly. The reflecting mirror 7 may be coated with a high-reflection film on a reflective surface to enhance the ability to reflect the laser beam. The path of the laser wavelength measurement optical path may be changed by the reflecting mirror 7, so that the structure of the device 2 for measuring a wavelength for a laser device is compact, and the volume of the device 2 for measuring a wavelength for a laser device may be reduced.

According to the embodiments of the present disclosure, as shown in FIG. 1A and FIG. 1B, the second optical path assembly further includes: a light homogenizing sheet 8, a field diaphragm 9 and a collimating mirror 10 arranged in sequence along the laser wavelength measurement optical path. After being converged by the first convergent mirror 6, the laser beam reflected by the reflecting mirror 7 of the first optical path assembly is reflected to the light homogenizing sheet 8 of the second optical path assembly. The light homogenizing sheet 8 is correspondingly arranged after the reflecting mirror 7 of the first optical path assembly in the laser wavelength measurement optical path, and configured to further homogenize the laser beam passing through the first optical path assembly and being incident on the second optical path assembly. The light homogenizing sheet 8 may be a frosted glass or another element having a homogenizing effect. The field diaphragm 9 is configured to control an imaging range of the laser beam further homogenized by the homogenizing sheet 8 in the hierarchical imaging, i.e., to control the imaging range of the interference fringe on an imaging plane of the imaging apparatus 15. The collimating mirror 10 is correspondingly arranged before the FP etalon assembly 11 in the laser wavelength measurement optical path, and is configured to ensure a collimating characteristic of the laser beam incident on the FP etalon assembly 11, and allow the laser beam passing through the homogenizing sheet 8 and the field diaphragm 9 in sequence to be incident on the FP etalon assembly 11 through the collimating mirror 10.

According to the embodiments of the present disclosure, as shown in FIGS. 1A and 1B, the second optical path assembly further includes: an aperture diaphragm 12 arranged between the FP etalon assembly 11 and the optical classifier 13 in the laser wavelength measurement optical path, and configured to limit a direction of the laser beam passing through the FP etalon assembly 11. According to the embodiments of the present disclosure, there may be at least two FP etalons (FP1 and FP2) in the FP etalon assembly 11, and the lasers beam passing through the two FP etalons pass through the aperture diaphragm 12, so that an intersection of the two laser beams may be prevented.

Those skilled in the art should understand that the at least two FP etalons in the FP etalon assembly 11 may also be three FP etalons, or more. Specifically, as shown in FIG. 1B, the FP etalon assembly 11 includes three FP etalons (FP1, FP2 and FP3).

Figure 5:
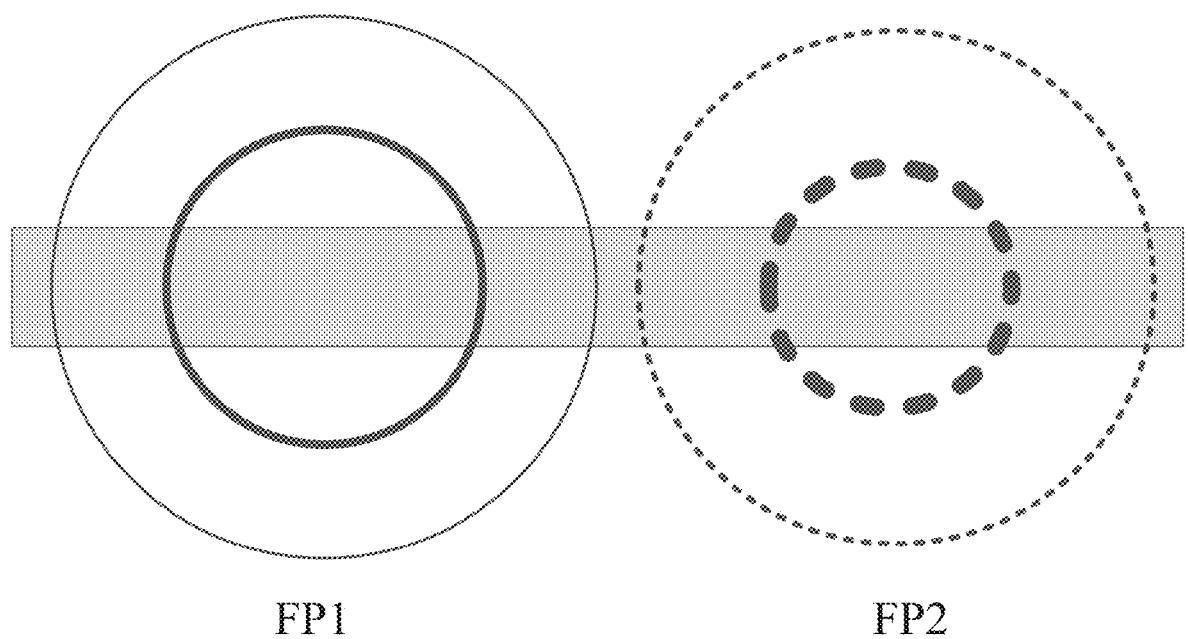
FIG. 5 is an imaging result on a CCD imaging apparatus of an interference fringe for a corresponding laser beam corresponding to the FP etalon assembly and the optical classifier of the device for measuring a wavelength for a laser device shown in FIG. 2 according to the embodiments of the present disclosure.

According to the embodiments of the present disclosure, as shown in FIGS. 1A and 1B, the second optical path assembly further includes: a second convergent mirror 14 and an imaging apparatus 15 arranged in sequence along the laser wavelength measurement optical path. The second convergent mirror 14 is arranged after the optical classifier 13 in the laser wavelength measurement optical path, and configured to converge the laser beam passing through the optical classifier 13 to the imaging apparatus 15. The imaging apparatus 15 is configured to image the laser beam passing through the second convergent mirror 14. The imaging apparatus 15 may be a CCD imaging camera. Specifically, the laser beam is incident on the optical classifier 13 after passing through the aperture diaphragm 12. The optical classifier 13 deflects the beams corresponding to different incident positions to have different exit angles, they are then incident on the second convergent mirror 14, and the two laser beams are finally incident on the imaging apparatus 15 to complete the imaging without affecting each other by the converging action of the second convergent mirror 14. Because of the existence of the optical classifier 13, the light passing through the FP etalon FP1 and the FP etalon FP2 is deflected to have different angles, so that the interference fringes for the FP etalon FP1 and the FP etalon FP2 may be imaged at different positions of the imaging apparatus 15, and different interference fringes may be obtained on the imaging apparatus 15 by selecting appropriate deflection angles. FIG. 5 shows the interference fringes for the FP etalon FP1 and FP etalon FP2 obtained on the CCD imaging camera. The left side is the interference fringe for FP1, and the right side is the interference fringe for FP2.

Figure 2:
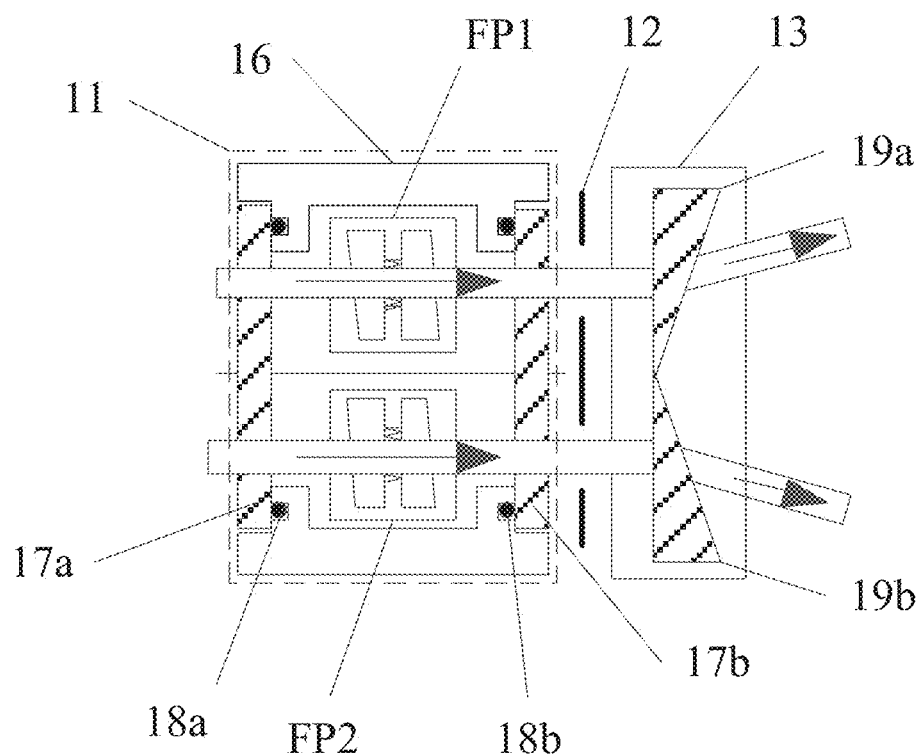
FIG. 2 is a schematic structural constitution diagram of an FP etalon assembly and an optical classifier of a device for measuring a wavelength for a laser device according to the embodiments of the present disclosure.

According to the embodiments of the present disclosure, as shown in FIG. 1A, 1B and FIG. 2, the FP etalon assembly 11 includes: a housing 16, a first FP etalon FP1, and a second FP etalon FP2. That is, in the embodiments of the present disclosure, the FP etalon assembly of the device 2 for measuring a wavelength for a laser device may be designed to have two FP etalons.

Those skilled in the art should understand that, as shown in FIG. 1B, the FP etalon assembly 11 may further include a third FP etalon FP3 arranged between the first FP etalon FP1 and the second FP etalon FP2.

Figure 6:
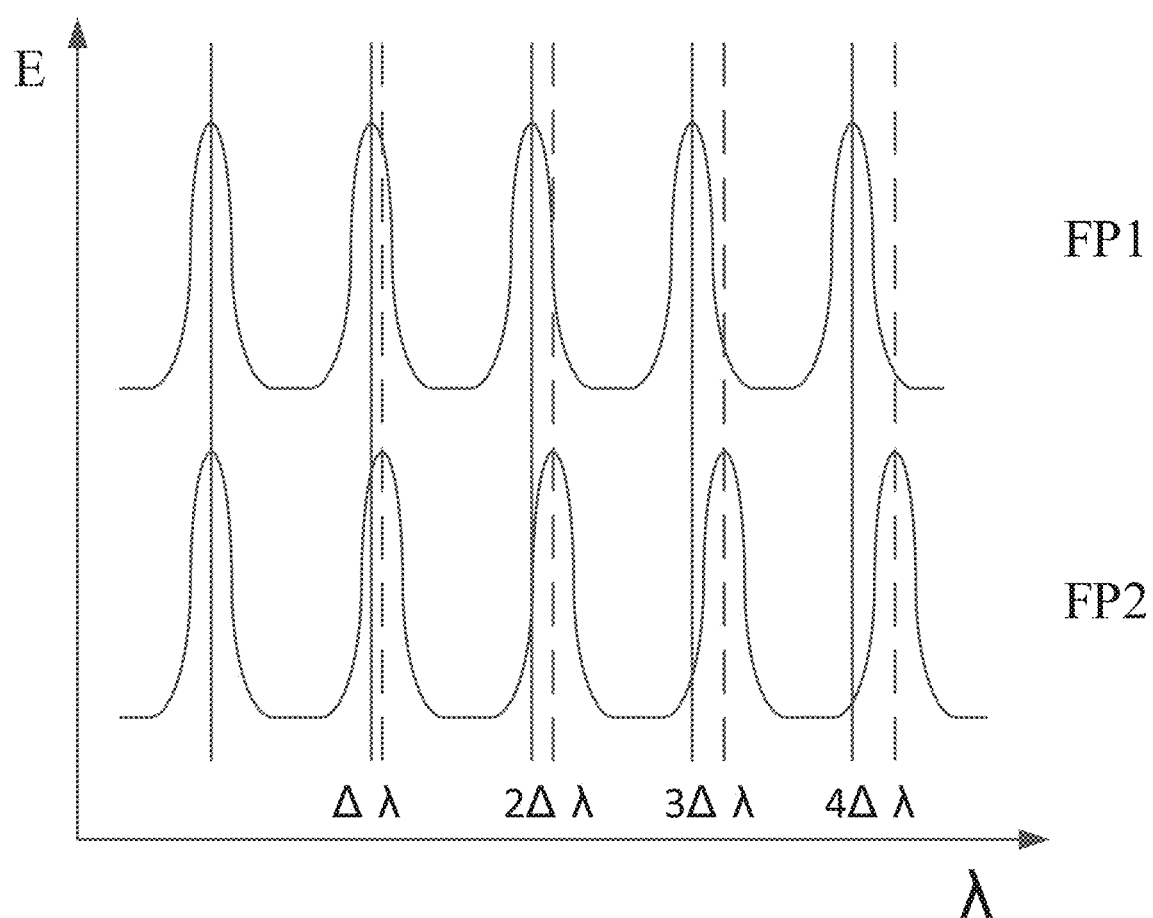
FIG. 6 is a schematic distribution diagram of a laser wavelength for a laser device of a device for measuring a wavelength for a laser device corresponding to an interference fringe thereof according to the embodiments of the present disclosure.

The housing 16 is configured to constitute a sealed cavity of the FP etalon assembly 11. The sealing cavity is configured to seal the first FP etalon FP1 and the second FP etalon FP2 arranged therein. The first FP etalon FP1 is arranged inside the sealed cavity, and configured to correspondingly generate a first interference fringe for the hierarchical imaging on the imaging apparatus 15. The second FP etalon FP2 is arranged inside the sealed cavity and corresponding to the first FP etalon FP1, and configured to correspondingly generate a second interference fringe for the hierarchical imaging. As shown in FIG. 2, the first FP etalon FP1 is arranged in an upper portion of the sealing cavity, and the second FP etalon FP2 is correspondingly arranged below the first FP etalon FP1. The first FP etalon FP1 and the second FP etalon FP2 may satisfy:

$$k = \frac{2|FSR_1 - FSR_2|}{|FSR_1 + FSR_2|}$$

wherein k<0.2, FSR1 is a free spectral range of the first FP etalon FP1, and FSR2 is a free spectral range of the second FP etalon FP2. In other words, the free spectral range FSR1 of the first FP etalon FP1 and the free spectral range FSR2 of the second FP etalon FP2 are similar. In the embodiments of the present disclosure, in the field of semiconductor processing technology, a wavelength variation range of an excimer laser device used in photolithography processes is usually several hundred pm. In order to ensure the measurement precision and the measurement range of the measurement of a wavelength for a laser device, it may be taken that FSR1=20 pm, and FSR2=20.5 pm. Those skilled in the art should understand that the values of the above parameters FSR1 and FSR2 are only specific implementation data according to the embodiments of the present disclosure, and are not specific limitations on the parameter data. On the other hand, as shown in FIG. 6, when the wavelength for the laser device changes, the distribution of the interference fringe for the laser beam generated by the FP etalon corresponding to the laser device of also changes accordingly. Therefore, after an FP etalon (such as the first FP etalon FP1) reaches a free spectral range FSR1, as the free spectral range FSR2 of the second FP etalon FP2 is slightly different from the free spectral range FSR1 of the first FP etalon FP1, the interference fringes respectively generated by the FP1 and FP2 do not repeat, so that the wavelength measurement range of the device 2 for measuring a wavelength for a laser device according to the present disclosure is extended, and the wavelength measurement range may achieve at least 410 pm (i.e., a product of the two FSR1×FSR2), which meets the wavelength measurement requirements of an excimer laser device. Meanwhile, two FP etalons enable the device 2 for measuring a wavelength for a laser device to have a high spectral resolution.

The above excimer laser device is taken as an example to further illustrate the wavelength measurement of the device 2 for measuring a wavelength for a laser device according to the embodiments of the present disclosure as follows.

For the FP etalon, the laser beam wavelength for the laser device incident on the laser wavelength measurement optical path (i.e., a center wavelength λ of the laser device to be measured) satisfies the following formula (1):

$$\lambda = \frac{2nd}{m}\cos\theta,$$

wherein λ is the center wavelength for the laser device, n is a refractive index of a gas in the FP etalon, d is a spacing of the FP etalon, m is a level of the interference fringe for the FP etalon, and θ is an exit angle of the laser beam corresponding to the FP etalon.

A radius of the interference fringe for the FP etalon is set to be r, when a focal length of the second convergent mirror 14 is f, according to the above radius r of the interference fringe corresponding to the FP etalon, it may be obtained that the center wavelength λ for the laser device measured by the FP etalon satisfies the following formula (2):

$$\lambda = \frac{2nd}{m}\left(1 - \frac{r^2}{2f^2}\right).$$

Correspondingly, in the embodiments of the present disclosure, when a spacing of the first FP etalon FP1 is $d_1$, a spacing of the second FP etalon FP2 is $d_2$, and the radiuses of the corresponding interference fringes (as shown in FIG. 5) are respectively $r_1$ and $r_2$, the center wavelengths for the corresponding laser devices respectively satisfy the following formulas (3) and (4):

$$\lambda_1 = \frac{2nd_1}{m}\left(1 - \frac{r_1^2}{2f^2}\right)$$

$$\lambda_2 = \frac{2nd_2}{m}\left(1 - \frac{r_2^2}{2f^2}\right).$$

In addition, according to the spacing $d_1$ of the first FP etalon FP1 and the spacing $d_2$ of the second FP etalon FP2, it may be obtained that the free spectral ranges of the first FP etalon FP1 and the second FP etalon FP2 respectively satisfy the following formulas (5) and (6):

$$FSR_1 = \frac{\lambda_0}{2nd_1}$$

$$FSR_2 = \frac{\lambda_0}{2nd_2}.$$

The interference fringes for the first FP etalon FP1 and the second FP etalon FP2 are respectively calculated, and it may be obtained that the center wavelengths for the laser devices respectively satisfy the following formulas (7) and (8):

$$\lambda_{FP1}=\lambda_1+N\cdot FSR_1$$

$$\lambda_{FP2}=\lambda_2+M\cdot FSR_2$$

wherein N and M are integers, and different integers N and M may be selected within a certain range to minimize $\lambda_{FP1}-\lambda_{FP2}$. At this time, the central wavelength $\lambda_{laser}$ for the laser device is obtained as:

$$\lambda_{laser} = \frac{\lambda_{FP1} + \lambda_{FP2}}{2}.$$

It may be seen that the measured central wavelength $\lambda_{laser}$ for the laser device is an average value of the respective fine measurement wavelengths of the two FP etalons (i.e., the first FP etalon FP1 and the second FP etalon FP2). The stability thereof is higher than the measurement result of a single FP etalon, and at the same time the wavelength measurement range is also achieved.

It should be noted that if there are three FP etalons, as shown in FIG. 1B, the free spectral ranges of the three FP etalons in the FP etalon assembly 11 are also required to be similar. The process of the fine measurement for the wavelength for the third FP etalon FP3 is the same as that of the first FP etalon FP1 and the second FP etalon FP2. At this time, the center wavelength for the laser device is an average value of the fine measurement wavelengths of the three PF etalons, so that the measurement precision of the center wavelength for the laser device may be further improved. Similarly, it is also applicable for the situation where there are more FP etalons in another FP etalon assembly 11, which will not be repeated here.

According to the embodiments of the present disclosure, as shown in FIG. 1A, FIG. 1B and FIG. 2, the housing 16 of the FP etalon assembly 11 includes: a first sealing groove, a first sealing ring 18a, a first window member 17a, a second sealing groove, a second sealing ring 18b and a second window member 17b, so as to ensure a great sealing effect on the sealing cavity of the housing 16.

The first sealing groove is arranged corresponding to a light inlet of the housing 16. As shown by the optical path arrows in FIG. 2, a light transmission port corresponding to the first window member 17a on a left side of the housing 16 is the light inlet. The first sealing groove may be designed to be an annular closed sealing groove structure concaved in the housing 16 around an edge of the light inlet. As shown in FIG. 2, the first sealing ring includes a first fixing groove and a first main body groove, which are respectively configured to correspondingly arrange the first sealing ring 18a and the first window member 17a.

The first sealing ring 18a is matched with the first sealing groove and arranged on the light inlet. Specifically, the first sealing ring 18a is arranged inside the first fixing groove. The first sealing ring 18a is designed to be an annular closed solid structure around the edge of the light inlet. A shape and a size thereof are designed to be matched with a shape and a size of the above first fixing groove, so that the first sealing ring 18a may be exactly mounted in the first fixing groove.

The first window member 17a is matched with the first sealing ring 18a and arranged inside the first sealing groove. Specifically, the first window member 17a is arranged inside the first main body groove. A size and a shape of the first window member 17a is designed to be matched with a shape and a size of the first main body groove, so that the first window member 17a is exactly mounted in the first main body groove, thereby cooperating with the first sealing ring 18a to seal the light inlet well.

The second sealing groove is arranged corresponding to a light outlet of the housing 16. As shown by the optical path arrows in FIG. 2, a light transmission port corresponding to the second window member 17b on a right side of the housing 16 is the light outlet. The second sealing groove may be designed to be an annular closed sealing groove structure concaved in the housing 16 around an edge of the light outlet. As shown in FIG. 2, the second sealing ring includes a second fixing groove and a second main body groove, which are respectively configured to correspondingly arrange the second sealing ring 18b and the second window member 17b.

The second sealing ring 18b is matched with the second sealing groove and arranged on the light outlet. Specifically, the second sealing ring 18b is arranged inside the second fixing groove. The second sealing ring 18b is designed to be an annular closed solid structure around the edge of the light outlet. A shape and a size thereof are designed to be matched with a shape and a size of the above second fixing groove, so that the second sealing ring 18b may be exactly mounted in the second fixing groove.

The second window member 17b is matched with the second sealing ring 18b and arranged inside the second sealing groove. Specifically, the second window member 17b is arranged inside the second main body groove. A size and a shape of the second window member 17b is designed to be matched with a shape and a size of the second main body groove, so that the second window member 17b is exactly mounted in the second main body groove, thereby cooperating with the second sealing ring 18b to seal the light outlet well.

Both the first sealing ring 18a and the second sealing ring 18b may be made of a material having an elastic deformation property such as rubber and silicone. Both the first window member 17a and the second window member 17b may be made of a material having a light transmitting property such as glass. In addition, both the first window member 17a and the second window member 17b are provided with anti-reflection films thereon, and/or a normal of a light entrance surface and/or a normal of a light exit surface of the first window member 17a forms a first included angle with an incident direction of the laser beam, and/or a normal of a light entrance surface and/or a normal of a light exit surface of the second window member 17b forms a second included angle with an incident direction of the laser beam, and the first included angle or the second included angle is 5 degrees to 10 degrees, so as to reduce the influence of the reflected light on the first window member 17a and the second window member 17b on the result of the wavelength measurement for the laser device. In other words, the laser beam may not be incident on the light entrance surface and/or the light exit surface of the first window member 17a and/or the second window member 17b at a vertical angle. Therefore, the first window member 17a and/or the second window member 17b may be a structure having a wedge angle; or, the first window member 17a is arranged at the light inlet at an oblique angle to seal the light inlet, and/or the second window member 17b is arranged at the light outlet at a certain oblique angle to seal the light outlet.

Those skilled in the art should understand that when there are a plurality of FP etalons in the FP etalon assembly 11 for measuring the optical path, for example three FP etalons as shown in FIG. 1B, the sealing manner of a plurality of FP etalons are the same with that of two FP etalons, i.e., they are all sealed in the same sealing cavity, which will not be repeated here.

According to an embodiment of the present disclosure, when the first window member 17a and the second window member 17b are structures having a wedge angle, the incident direction of the incident laser beam may not be perpendicular to the light entrance surface and the light exit surface of the first window member 17a. The normal of the light entrance surface or the normal of the light exit surface of the first window member 17a forms the first included angle with the incident direction of the laser beam, and the first included angle is 5 degrees to 10 degrees. Likewise, the normal of the light entrance surface or the normal of the light exit surface of the second window member 17b forms the second included angle with the incident direction of the laser beam, and the second included angle is 5 degrees to 10 degrees.

According to another embodiment of the present disclosure, the first window member 17a may also be a structure not having a wedge, for example, such as flat glass, and is mounted obliquely to the light inlet of the housing 16. The incident direction of the laser beam respectively forms an included angle of 5-10 degrees with the normal of the light entrance surface and the normal of the light exit surface of the first window member 17a, i.e., the incident direction of the incident laser beam is not allowed to be perpendicular to the light entrance surface and/or light exit surface of the first window member 17a. Likewise, the second window member 17b may be obliquely mounted to the light outlet of the housing 16, and details are not repeated here. In the embodiments of the present disclosure, the light entrance surface is a surface of an optical element on which light is irradiated, and the light exit surface is a surface of the optical element from which the light exits, which may generally be a back surface of the light entrance surface.

In this way, it may be ensured that the first FP etalon FP1 and the second FP etalon FP2 are in the same sealed environment, so as to ensure the stability and precision of the wavelength measurement for the laser device.

According to the embodiments of the present disclosure, as shown in FIG. 1A, FIG. 1B and FIG. 2, the optical classifier 13 includes a first deflecting member 19a and a second deflecting member 19b, which are configured to deflect the laser beam passing through the optical classifier 13. The first deflecting member 19a has a first wedge angle and is configured to deflect the laser beam passing through the first FP etalon FP1. The light entrance surface of the first deflecting member 19a is perpendicular to the incident direction of the laser beam passing through the first FP etalon FP1, and the light exit surface of the first deflecting member 19a is an inclined plane, so that there is an included angle corresponding to the first wedge angle between the light exit surface and the light entrance surface of the first deflecting member 19a, and the first wedge angle may be set corresponding to a top end of the first deflecting member 19a.

Correspondingly, the second deflecting member 19b has a second wedge angle, is arranged corresponding to the first wedge angle of the first deflecting member 19a through the second wedge angle, and is configured to deflect the laser beam passing through the second FP etalon FP2. The light entrance surface of the second deflecting member 19b is perpendicular to the incident direction of the laser beam passing through the second FP etalon FP2, and the light exit surface of the second deflecting member 19b is an inclined plane, so that there is an included angle corresponding to the second wedge angle between the light exit surface and the light entrance surface of the second deflecting member 19b. The first wedge angle may be equal to the second wedge angle, and the second wedge angle may be set corresponding to a top end of the second deflecting member 19b.

In the embodiments of the present disclosure, in order to prevent the laser beam deflected by the first deflecting member 19a from intersecting with the laser beam deflected by the second deflecting member 19b, the first deflecting member 19a and the second deflecting member 19b need to be arranged opposite to each other at the top ends. That is, the top end of the first deflecting member 19a having the first wedge angle is in contact with the top end of the second deflecting member 19b having the second wedge angle, and the light entrance surface of the first deflecting member 19a is flush with the light entrance surface of the second deflecting member 19b in a direction perpendicular to a light entrance direction.

In another embodiment of the present disclosure, the light entrance surface of the first deflecting member 19a may not be perpendicular to the incident direction of the laser beam passing through the first FP etalon FP1. Likewise, the light entrance surface of the second deflecting member 19b may not be perpendicular to the incident direction of the laser beam passing through the first FP etalon FP1. At this time, the first deflecting member 19a and the second deflecting member 19b may also be arranged opposite to each other at the top ends.

Therefore, after the laser beam passing through the FP etalon assembly passes through the aperture diaphragm 12, a formed spatial position changes, and it is divided into two laser beams, which are incident on the optical classifier 13. The optical classifier 13 respectively deflects the two laser beams adopts using the first deflecting member 19a and the second deflecting member 19b, change their respective exit angles, and make their exit directions different, so that when they are incident on the imaging apparatus 15 (such as a CCD imaging camera), the imaging apparatus 15 may obtain the interference fringes corresponding to different positions of the respective laser beams.

It should be further illustrated that, as shown in FIG. 1B, in the situation that the FP etalon assembly 11 includes three FP etalons, a third FP etalon FP3 is arranged between the first FP etalon FP1 and the second FP etalon FP2. Moreover, when a central optical axis of the third FP etalon FP3 is correspondingly coincident with a central optical axis of the second convergent mirror 14, a position corresponding to the third FP etalon FP3 in the optical classifier 13 may no longer be provided with a corresponding deflecting member. That is, as shown in FIG. 1B, the light beam passing through the third FP etalon FP3 may be vertically incident on a center of the second convergent mirror 14 directly, and directly incident on the imaging apparatus 15 after passing through the second convergent mirror 14. Therefore, those skilled in the art should understand that for the situation that the FP etalon assembly 11 includes more FP etalons, the optical paths and a corresponding number and setting positions of the deflecting members may also be obtained accordingly, which will not be repeated here.

Figure 3:
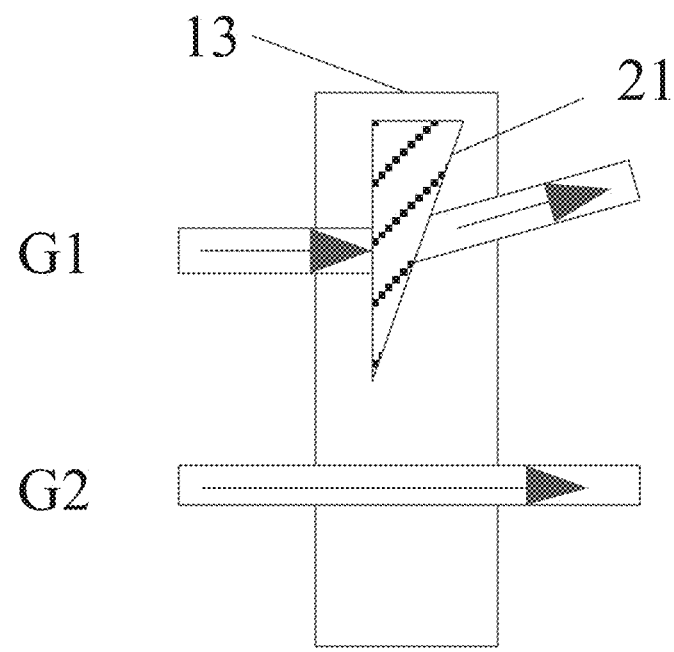
FIG. 3 is a schematic structural constitution diagram of another optical classifier of a device for measuring a wavelength for a laser device according to the embodiments of the present disclosure.

According to another embodiment of the present disclosure, as shown in FIG. 1A, FIG. 1B, and FIG. 3, the optical classifier further includes: a third deflecting member 21 having a third wedge angle and configured to deflect the laser beam G1 passing through the first FP etalon FP1, or deflect the laser beam G2 passing through the second FP etalon FP2. Likewise, the light entrance surface of the third deflecting member 21 is perpendicular to the incident direction of the laser beam G1 (or the laser beam G2). The light exit surface of the third deflecting member 21 is an inclined plane, so that there is an included angle corresponding to the third wedge angle between the light exit surface and the light entrance surface of the third deflecting member 21. At this time, the optical classifier 13 only has a function of deflecting the laser beam G1 (or the laser beam G2) incident on the third deflecting member 21. For the other laser beam G2 (or the laser beam G1) not incident on the third deflecting member 21, it may directly exit without a deflection angle, and is finally incident on the imaging apparatus 15 for imaging.

In other words, the optical classifier 13 may be designed to include only one third deflecting member 21 to deflect two incident laser beams and make their exit directions different, so that when they are incident on the imaging apparatus 15 (such as a CCD imaging camera), the imaging apparatus 15 may obtain interference fringes corresponding to different positions of the respective laser beams. The third deflecting member 21 only occupies a portion of a space of an upper end or a portion of a space of a lower end of the original optical classifier 13, and thus has a small volume size. This may reduce the size of the optical classifier 13, which is conducive to reduce the size of the laser measurement device of the present disclosure.

Figure 4:
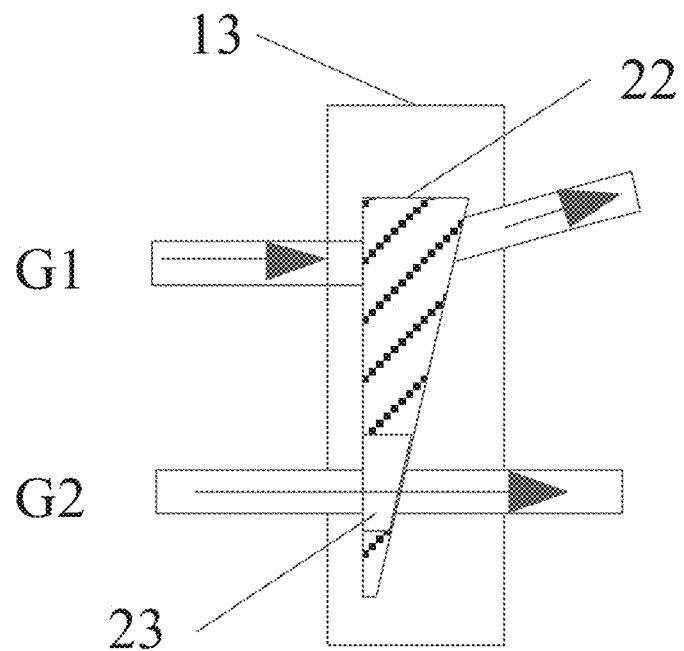
FIG. 4 is a schematic structural constitution diagram of yet another optical classifier of a device for measuring a wavelength for a laser device according to the embodiments of the present disclosure.

According to yet another embodiment of the present disclosure, as shown in FIG. 1A, FIG. 1B, and FIG. 4, the optical classifier 13 includes: a fourth deflecting member 22, including: a light transmitting hole 23 penetrating the fourth deflecting member 22 parallel to a light entrance direction of the laser beam. Specifically, the fourth deflecting member 22 has a fourth wedge angle and is configured to deflect the laser beam G1 passing through the first FP etalon FP1, or deflect the laser beam G2 passing through the second FP etalon FP2. Likewise, the light entrance surface of the fourth deflecting member 22 is perpendicular to the incident direction of the laser beam G1 (or the laser beam G2). The light exit surface of the fourth deflecting member 22 is an inclined plane, so that there is an included angle corresponding to the fourth wedge angle between the light exit surface and the light entrance surface of the fourth deflecting member 22. The light transmitting hole 23 may be drilled on the fourth deflecting member 22 near a top portion of the fourth wedge angle, so that it is spaced from a main body of the fourth deflecting member 22 at a certain distance to avoid mutual influence.

Therefore, when the fourth deflecting member 22 deflects the laser beam G1, the light transmitting hole 23 is configured to allow the laser beam G2 to penetrate the light transmitting hole 23. When the fourth deflecting member 22 deflects the laser beam G2, the light transmitting hole is configured to allow the laser beam G1 to penetrate the light transmitting hole 23.

It can be seen that the optical classifier 13 may be designed to include only one fourth deflecting member 22 to deflect two incident laser beams and make their exit directions different, thereby achieving a similar technical effect as the third deflecting member 21. The fourth deflecting member 22 may occupy most of a space of the optical classifier 13, and a volume size thereof may ensure the convenience of processing and production.

Finally, those skilled in the art should understand that the explanation of the optical classifier 13 in the above embodiments is not intended to limit it. As shown in FIG. 1A, FIG. 1B, FIG. 2, FIG. 3 and FIG. 4, the first deflecting member 19a, the second deflecting member 19b, the third deflecting member 21, or the fourth deflecting member 22 may be a deflecting prism, or may be an element or a structure having an effect of deflecting a laser beam, such as a reflecting mirror, a rotating mirror, or a micro vibration mirror.

According to another aspect of the present disclosure, there is provided a system for measuring a wavelength for a laser device. As shown in FIG. 1A and FIG. 1B, the system for measuring a wavelength for a laser device includes the above device 2 for measuring a wavelength for a laser device and a laser device 1. The laser device 1 is configured to generate a laser beam incident on the device 2 for measuring a wavelength for a laser device. A center wavelength of a corresponding laser beam to be measured is obtained by the device 2 for measuring a wavelength for a laser device. The laser 1 and the device 2 for measuring a wavelength for a laser device have a design of an online measurement and a closed-loop control feedback.

According to yet another aspect of the present disclosure, there is provided a method for measuring a wavelength for a laser device applied in the above device 2 for measuring a wavelength for a laser device to measure a central wavelength of the laser beam of the laser device 1 according to the measurement and operation process of the wavelength for the laser device mentioned above.

According to the present disclosure, there is provided a device and a method for measuring a wavelength for a laser device. The device for measuring a wavelength for a laser device includes: a first optical path assembly and a second optical path assembly. The first optical path assembly is configured to homogenize a laser beam emitted by the laser device. The second optical path assembly constitutes a laser wavelength measurement optical path with the first optical path assembly, and is configured to perform a hierarchical imaging on the laser beam homogenized by the first optical path assembly. The second optical path assembly includes: an FP etalon assembly and an optical classifier. The homogenized laser beam passes through the FP etalon assembly to generate an interference fringe. The optical classifier is arranged after the FP etalon assembly in the laser wavelength measurement optical path, and configured to deflect the laser beam passing through the FP etalon assembly, so as to achieve the hierarchical imaging. The FP etalon assembly of the present disclosure allows two FP etalons to share the same optical path for an interference imaging, and therefore a compact structure having a small volume, a simple design, and a high stability are achieved. In cooperation with the optical classifier, a precise measurement for a laser wavelength may be achieved, and at the same time a wavelength measurement range is large. It is suitable for an online measurement for a laser wavelength and a corresponding closed-loop control feedback.

The specific embodiments above further describe the objectives, technical solutions and beneficial effects of the present disclosure in detail. It should be understood that the above are only specific embodiments of the present disclosure, and are not intended to limit the present disclosure. Within the spirit and principle of the present disclosure, any modifications, equivalent replacements, improvements, etc. should be included within the protection scope of the present disclosure.

What is claimed is:

1. A device for measuring a wavelength for a laser device, comprising:
   a first optical path assembly configured to homogenize a laser beam emitted by the laser device; and
   a second optical path assembly constituting a laser wavelength measurement optical path with the first optical path assembly, and configured to perform a hierarchical imaging on the laser beam homogenized by the first optical path assembly;

wherein the second optical path assembly comprises:

an FP etalon assembly comprising at least two FP etalons, the homogenized laser beam passing through the FP etalon assembly to generate an interference fringe; and an optical classifier arranged after the FP etalon assembly in the laser wavelength measurement optical path, and configured to deflect the laser beam passing through the FP etalon assembly, so as to achieve the hierarchical imaging.

2. The device according to claim 1, wherein the first optical path assembly comprises: a beam splitter and a light homogenizing assembly arranged in sequence along the laser wavelength measurement optical path, wherein, the beam splitter is configured to reflect a portion of the laser beam emitted by the laser device to the laser wavelength measurement optical path;

the light homogenizing assembly is configured to homogenize the laser beam reflected by the beam splitter to the laser wavelength measurement optical path; and the homogenizing assembly comprises: an optical light homogenizing element, a first convergent mirror and a reflecting mirror arranged in sequence along the laser wavelength measurement optical path, wherein, the optical light homogenizing element is configured to homogenize the laser beam, so as to reduce an influence of a quality of the laser beam on a measurement precision;

the first convergent mirror is configured to converge the laser beam homogenized by the optical light homogenizing element to the second optical path assembly; and the reflecting mirror is configured to reflect the laser beam converged by the first convergent mirror to the second optical path assembly.

3. The device according to claim 1, wherein the second optical path assembly further comprises: a light homogenizing sheet, a field diaphragm, a collimating mirror, a second convergent mirror and an imaging apparatus arranged in sequence along the laser wavelength measurement optical path, wherein, the light homogenizing sheet is correspondingly arranged after the first optical path assembly in the laser wavelength measurement optical path, and configured to further homogenize the laser beam passing through the first optical path assembly and being incident on the second optical path assembly;

the field diaphragm is configured to control an imaging range of the laser beam homogenized by the light homogenizing sheet in the hierarchical imaging;

the collimating mirror is correspondingly arranged before the FP etalon assembly in the laser wavelength measurement optical path, and configured to ensure a collimating characteristic of the laser beam incident on the FP etalon assembly;

the second convergent mirror is arranged after the optical classifier in the laser wavelength measurement optical path, and configured to converge the laser beam passing through the optical classifier to the imaging apparatus; and the imaging apparatus is configured to image the laser beam passing through the second convergent mirror.

4. The device according to claim 1, wherein the second optical path assembly further comprises:

an aperture diaphragm arranged between the FP etalon assembly and the optical classifier in the laser wavelength measurement optical path, and configured to limit a direction of the laser beam passing through the FP etalon assembly.

5. The device according to claim 1, wherein the FP etalon assembly comprises:

a housing configured to constitute a sealed cavity of the FP etalon assembly;

a first FP etalon arranged inside the sealed cavity, and configured to correspondingly generate a first interference fringe for the hierarchical imaging; and a second FP etalon arranged inside the sealed cavity and corresponding to the first FP etalon, and configured to correspondingly generate a second interference fringe for the hierarchical imaging.

6. The device according to claim 5, wherein the first FP etalon and the second FP etalon satisfy:

$$k = \frac{2|FSR_1 - FSR_2|}{|FSR_1 + FSR_2|}$$

wherein k<0.2, $FSR_1$ is a free spectral range of the first FP etalon, and $FSR_2$ is a free spectral range of the second FP etalon.

7. The device according to claim 5, wherein the housing comprises:

a first sealing groove arranged corresponding to a light inlet of the housing;

a first sealing ring matched with the first sealing groove and arranged on the light inlet;

a first window member matched with the first sealing ring and arranged inside the first sealing groove;

a second sealing groove arranged corresponding to a light outlet of the housing;

a second sealing ring matched with the second sealing groove and arranged on the light outlet; and a second window member matched with the second sealing ring and arranged inside the second sealing groove; wherein, the first window member and the second window member are both provided with anti-reflection films thereon, or a normal of a light entrance surface and/or a normal of a light exit surface of the first window member forms a first included angle with an incident direction of the laser beam, and/or a normal of a light entrance surface and/or a normal of a light exit surface of the second window member forms a second included angle with an incident direction of the laser beam, and the first included angle or the second included angle is 5 degrees to 10 degrees.

8. The device according to claim 1, wherein the optical classifier comprises:

a first deflecting member having a first wedge angle and configured to deflect the laser beam passing through the first FP etalon; and a second deflecting member having a second wedge angle arranged corresponding to the first wedge angle of the first deflecting member, and configured to deflect the laser beam passing through the second FP etalon.

9. The device according to claim 1, wherein the optical classifier comprises:

a third deflecting member having a third wedge angle and configured to deflect the laser beam passing through the first FP etalon, or deflect the laser beam passing through the second FP etalon; or a fourth deflecting member, comprising:

a light transmitting hole penetrating the fourth deflecting member parallel to a light entrance direction of the laser beam, wherein, when the fourth deflecting member deflects the laser beam passing through the first FP etalon, the light transmitting hole is configured to allow the laser beam passing through the second FP etalon to penetrate the light transmitting hole; and when the fourth deflecting member deflects the laser beam passing through the second FP etalon, the light transmitting hole is configured to allow the laser beam passing through the first FP etalon to penetrate the light transmitting hole.

10. A method for measuring a wavelength for a laser device, applied in the device for measuring a wavelength for a laser device according to claim 1 to measure a laser wavelength generated by the laser device.

* * * * *